(12) United States Patent
Hart, Jr. et al.

(10) Patent No.: US 6,177,727 B1
(45) Date of Patent: Jan. 23, 2001

(54) SADDLE BRACKET FOR SOLID STATE PRESSURE GAUGE

(75) Inventors: John W. Hart, Jr., Mesa; William G. McDonald, Phoenix; Daniel John Wallace, Jr., Glendale, all of AZ (US)

(73) Assignee: Motorola, Inc., Schaumburg, IL (US)

( * ) Notice: Under 35 U.S.C. 154(b), the term of this patent shall be extended for 0 days.

(21) Appl. No.: 09/071,185

(22) Filed: May 1, 1998

(51) Int. Cl.[7] .............. H01L 27/14; H01L 29/82; H01L 29/84; G01L 9/06; G01L 7/08

(52) U.S. Cl. .............. 257/727; 257/730; 257/731; 257/668; 257/732; 257/417; 257/419; 257/724; 257/693; 257/726; 257/718; 257/414; 257/704; 73/718; 73/727; 73/756; 73/721; 73/726; 73/724; 73/754; 361/283.4; 361/813; 338/42

(58) Field of Search .................. 257/677, 679, 257/727, 728, 678, 718, 414, 415, 417–419, 668, 693, 726, 704, 666, 676, 724, 725, 730–733; 361/813, 829, 283.4; 73/718, 727, 721, 726, 724, 725, 723, 754, 756; 338/4, 42

(56) References Cited

U.S. PATENT DOCUMENTS

| | | | |
|---|---|---|---|
| 4,670,730 | * | 6/1987 | Takeda et al. . |
| 5,033,032 | * | 7/1991 | Houghtaling ................ 367/160 |
| 5,661,245 | * | 8/1997 | Svoboda et al. ................ 73/726 |
| 5,686,698 | | 11/1997 | Mahadevan et al. ........... 174/52.4 |
| 5,693,882 | * | 12/1997 | Englund et al. ................ 73/723 |
| 5,714,738 | * | 2/1998 | Hauschulz et al. ............ 219/535 |
| 5,805,430 | * | 9/1998 | Atwood et al. ................. 361/829 |
| 5,834,834 | * | 11/1998 | Lee et al. ........................ 257/679 |
| 5,859,759 | * | 1/1999 | Moriyama et al. ........... 361/283.4 |
| 5,945,736 | * | 8/1999 | Rife et al. ....................... 257/719 |
| 5,948,992 | * | 9/1999 | Yamamoto ....................... 73/754 |
| 5,956,018 | * | 9/1999 | Pejic et al. ...................... 345/157 |
| 6,012,600 | * | 1/2000 | Pham et al. .................. 220/203.1 |
| 6,018,194 | * | 1/2000 | Moss et al. ..................... 257/727 |
| 6,018,249 | * | 1/2000 | Akram et al. .................. 324/758 |
| 6,043,667 | * | 3/2000 | Cadwallader et al. ......... 324/758 |
| 6,066,882 | * | 5/2000 | Kato ................................ 257/417 |
| 6,079,276 | * | 6/2000 | Frick et al. ...................... 73/718 |
| 6,122,974 | * | 9/2000 | Sata et al. ........................ 73/754 |

\* cited by examiner

Primary Examiner—Alexander O. Williams
(74) Attorney, Agent, or Firm—Anthony M. Martinez

(57) ABSTRACT

A semiconductor component (31) and a method for coupling a semiconductor device (36) to a substrate (81). The semiconductor component (31) includes a saddle (34) and the semiconductor device (36). The saddle (34) has a plurality of sides (51, 52, 53, 54, 55) that form a semiconductor device receiving area (58). The semiconductor device (36) is inserted into the semiconductor device receiving area (58) and secured in the semiconductor device receiving area (58) using tabs (66, 67). The saddle (34) is coupled to the substrate (81) by fasteners (82,83).

8 Claims, 3 Drawing Sheets

- *PRIOR ART* -

SADDLE BRACKET FOR SOLID STATE PRESSURE GAUGE

FIELD OF THE INVENTION

The present invention relates, in general, to semiconductor components and, more particularly, to mounting semiconductor devices to a substrate.

BACKGROUND OF THE INVENTION

Typically, semiconductor devices such as sensors are manufactured by mounting a semiconductor chip to a leadframe, electrically connecting die pads on the semiconductor chip to leadframe leads, and enclosing the semiconductor chip and a portion of the leadframe within a packaging material. The semiconductor device is then mounted to a substrate by soldering the leads to corresponding bond pads on a substrate such as a Printed Circuit Board (PCB). In the example of a sensor, one or both sides of the semiconductor chip are exposed to an ambient environment via ports that are adhesively coupled to the packaging material.

A drawback with this type of sensor is that the packaging material, the material of the ports, and the adhesive material each have different coefficients of thermal expansion. Thus, when the semiconductor device is thermally stressed, the materials expand or contract at different rates, imparting a mechanical stress on the semiconductor die. The semiconductor die, which contains the sensor transducer, then produces erroneous results. Therefore, the sensor produces erroneous results. Another drawback to this type of sensor is that the step of soldering the leads to the substrate imparts a mechanical stress on the semiconductor die so that the sensor produces erroneous results.

Accordingly, it would be advantageous to have an apparatus and method for reducing stress on a semiconductor die. It would be of further advantage for the apparatus to be have a small form factor and be easily and cost effectively integrated into standard manufacturing processes.

DETAILED DESCRIPTION OF THE DRAWINGS

Generally, the present invention provides a semiconductor mounting structure or saddle and a method for coupling a semiconductor device to a substrate using the saddle. The saddle has a semiconductor device receiving area in which a semiconductor device is placed. The saddle is coupled to a substrate, thereby coupling the semiconductor device to the substrate. An advantage of the present invention is that the saddle reduces mechanical stresses at the electrical interface between the electrical interconnects of the semiconductor device and the substrate.

Figure 1:
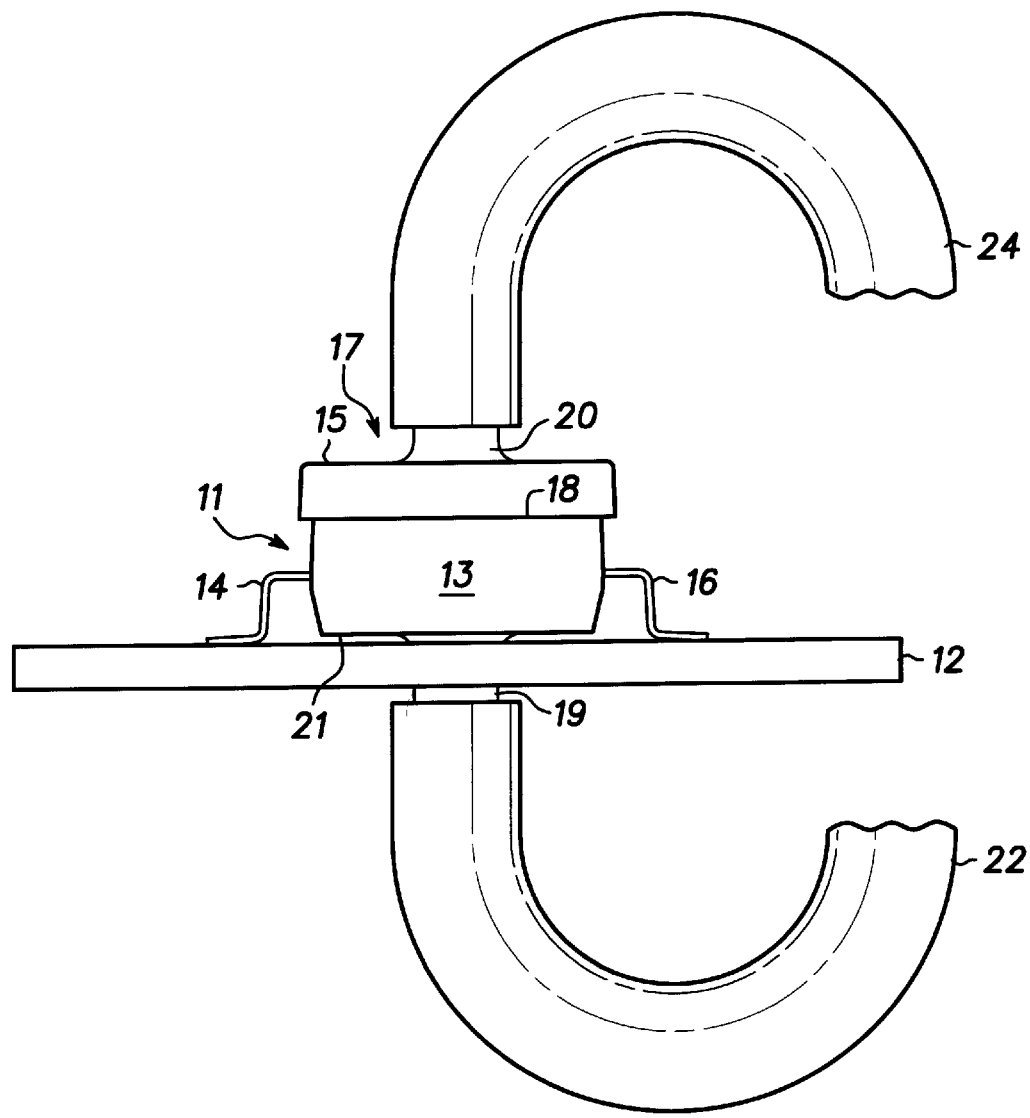
FIG. 1 is a side view of a prior art electronic assembly.

FIG. 1 is a side view of a prior art electronic assembly 10 having a semiconductor component 11 mounted to a substrate 12. Semiconductor component 11 is comprised of a body 13 and a hose port 17. More particularly, hose port 17 is connected to a top surface 18 of body 13. Electrical interconnects or leads 14 and 16 extend from body 13. Hose port 17 has a hose barb 20 that extends from a top surface 15 of hose port 17. Likewise, body 13 has a hose barb 19 that extends from a bottom surface 21 of body 13 through an opening (not shown in FIG. 1) in substrate 12. Leads 14 and 16 are soldered to substrate 12. Hoses 22 and 24 are connected to hose barbs 19 and 20, respectively. Typically, hoses 22 and 24 are bent so that assembly 10 has a low profile.

A problem with assembly 10 is that connecting hoses 22 and 24 to the respective hose barbs 19 and 20 creates mechanical stresses at leads 14 and 16. In addition, the mechanical stresses are applied to an electrical interface between leads 14 and 16 and substrate 12. The mechanical stresses are generated by the weight of hoses 22 and 24 and the bending of hoses 22 and 24.

Figure 2:
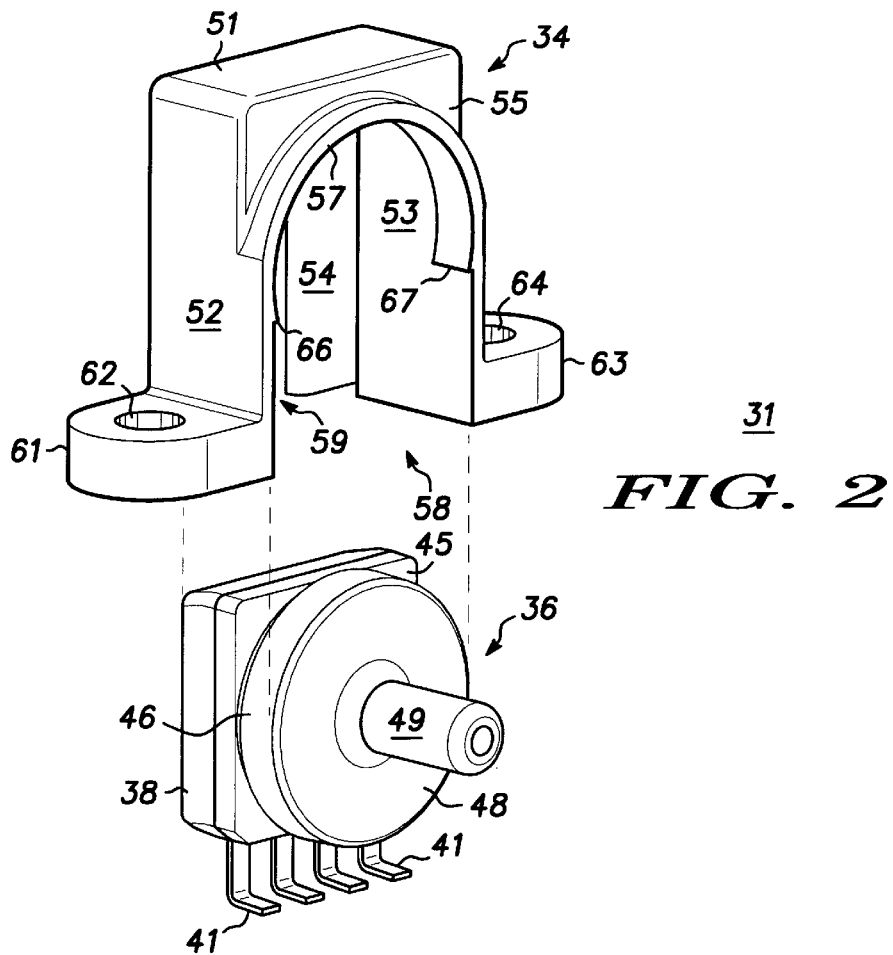
FIG. 2 is an exploded isometric view of a semiconductor component in accordance with a first embodiment of the present invention.

FIG. 2 is an exploded isometric view of a semiconductor component 31 in accordance with a first embodiment of the present invention. Semiconductor component 31 includes a saddle 34 and a semiconductor device 36. By way of example, semiconductor device 36 is a Single In-line Package (SIP) lateral pressure sensor having a body 38 and leads 41 extending from body 38. Further, semiconductor device 36 has a hose port 46 connected to a top surface 45 of body 38. Hose port 46 has a top surface 48 and a hose barb 49 extending from top surface 48.

Saddle 34 has a plurality of walls or sides 52, 53, 54, and 55, which extend from and are perpendicular to a side 51. Side 52 has a clip or tab 66 and side 53 has a tab 67. Sides 52 and 53 are parallel and opposite each other and sides 54 and 55 are parallel and opposite each other. Side 54 has a notch 59 and side 55 has a lip 57 extending therefrom. It should be noted that lip 57, notch 59, and tabs 66 and 67 are not limitations of the present invention. Saddle 34 can be manufactured without lip 57, notch 59, and tabs 66 and 67.

Sides 51, 52, 53, 54, and 55 cooperate to form a semiconductor device receiving area 58. A fastening portion 61 having an opening 62 extends from side 52 and a fastening portion 63 having an opening 64 extends from side 53.

Suitable materials for saddle 34 include plastic, metal, ceramics, or the like. Techniques for manufacturing saddle 34 include machining, extruding, bonding, casting, stamping, molding, or the like. Preferably, saddle 34 is a unitary structure formed of a plastic material.

Semiconductor component 31 is formed by inserting semiconductor device 36 into semiconductor device receiving area 58 of saddle 34. Tabs 66 and 67 secure semiconductor device 36 in semiconductor device receiving area 58. Thus, semiconductor device 36 is located in semiconductor device receiving area 58.

It should be noted that the shape of semiconductor device receiving area 58 is not a limitation of the present invention. The shape of semiconductor device receiving area 58 can be formed for receiving other types of semiconductor devices having package characteristics different from those of semiconductor device 36. For example, the shape of semiconductor device receiving area 58 can be formed for inserting an accelerometer into semiconductor device receiving area 58.

Figure 3:
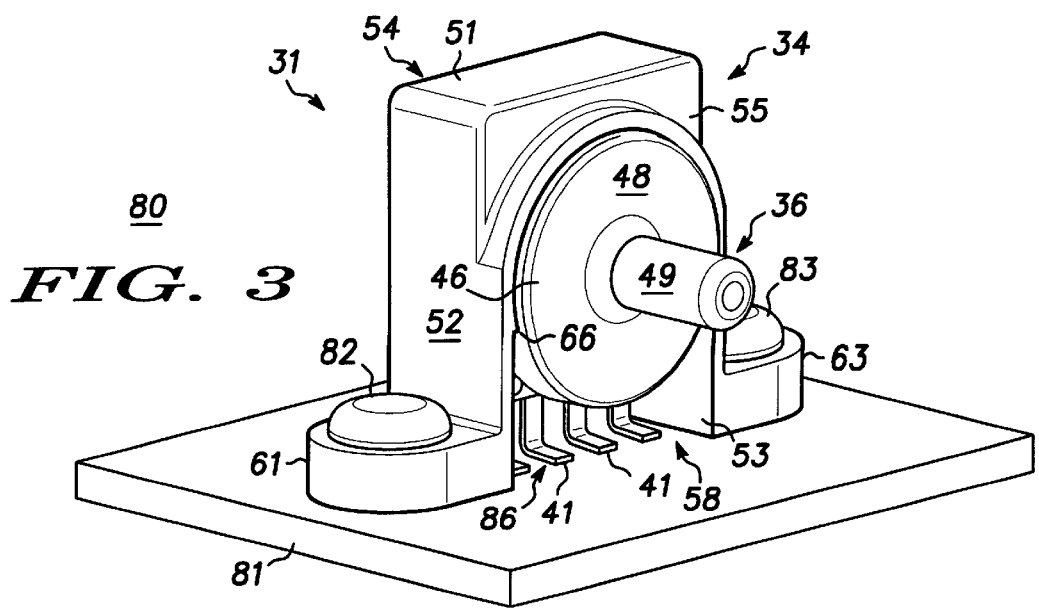
FIG. 3 is an isometric view of an electronic assembly having the semiconductor component of FIG. 2 mounted on a substrate.

FIG. 3 is an isometric view of an electronic assembly 80 having semiconductor component 31 mounted on a substrate 81 such as, for example, a Printed Circuit Board (PCB). It should be understood that the same reference numerals are used in the figures to denote the same elements. For purposes of clarity, some of the reference numerals from FIG. 2 are not shown in FIG. 3. By way of example, semiconductor component 31 is compatible with standard surface mounting processes and is mounted on substrate 81 using standard semiconductor pick and place equipment. Saddle 34 is coupled to substrate 81 via fasteners 82 and 83, thereby clampably coupling semiconductor device 36 to substrate 81. In other words, semiconductor device 36 is coupled to substrate 81 by attaching saddle 34 to substrate 81. It should be noted that saddle 34 is not attached to semiconductor device 36. As discussed hereinbefore, tab 66 and tab 67 (hidden from view in FIG. 3) secure semiconductor device 36 in semiconductor device receiving area 58. Although saddle 34 is shown as being coupled to substrate 81 by fasteners 82 and 83, this is not a limitation of the present invention. Saddle 34 can be coupled to substrate 81 by other techniques such as, for example, adhesively bonding saddle 34 to substrate 81. Leads 41 are soldered to substrate 81.

Saddle 34 minimizes mechanical stresses that are applied to leads 41 and to an electrical interface 86 between leads 41 and substrate 81. These stresses can cause failure of electrical interface 86, i.e., failure of the electrical bonds between the leads and substrate 81. For example, when a hose (not shown) is connected to hose barb 49, mechanical stresses from the weight of the hose and the bending of the hose are applied to semiconductor device 36. These mechanical stresses cause semiconductor device 36 to move within semiconductor device receiving area 58. Saddle 34 limits the movement of semiconductor device 36, thereby reducing the mechanical stresses applied to electrical interface 86. In addition, assembly 80 has a low profile and allows a hose connected to hose barb 49 to be parallel to substrate 81.

In another example, assembly 80 is used in an automotive system that is subject to vibration from external forces. Without saddle 34, when assembly 80 is vibrated the weight of semiconductor device 36 causes a mechanical stress that is applied to electrical interface 86. With saddle 34, when assembly 80 is vibrated saddle 34 limits the vibration of semiconductor device 36. Therefore, the mechanical stress applied to electrical interface 86 is reduced.

Figure 4:
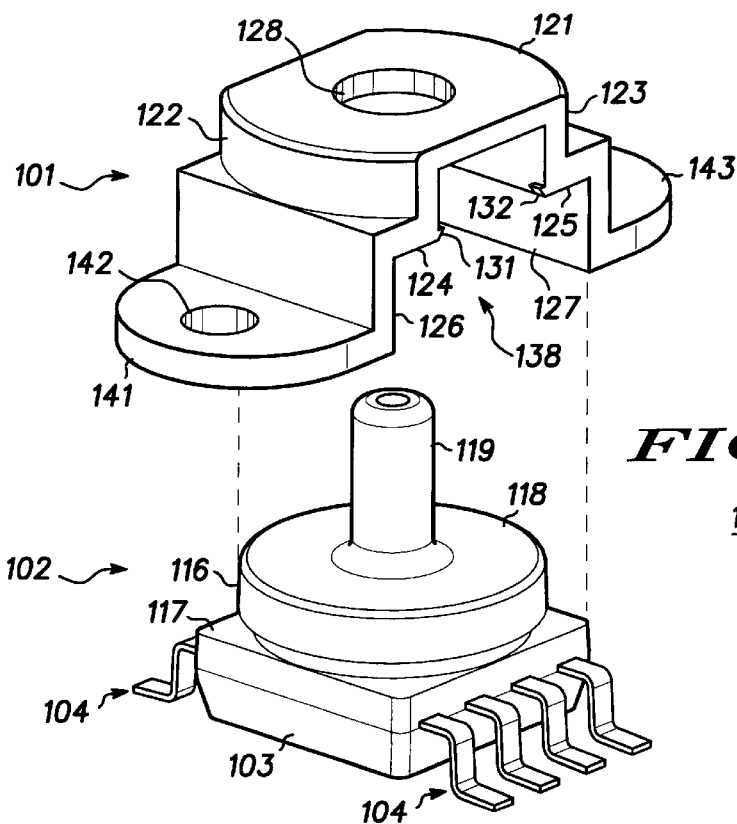
FIG. 4 is an exploded isometric view of a semiconductor component in accordance with a second embodiment of the present invention.

FIG. 4 is an exploded isometric view of a semiconductor component 100 in accordance with a second embodiment of the present invention. Semiconductor component 100 includes a saddle 101 and a semiconductor device 102. By way of example, semiconductor device 102 is a Dual In-line Package (DIP) pressure sensor having a body 103 and leads 104 extending therefrom. It should be noted that some of the leads of device 102 are hidden from view. Further, semiconductor device 102 has a hose port 116 connected to a top surface 117 of body 103. Hose port 116 has a top surface 118 and a hose barb 119 extending from top surface 118.

Saddle 101 has a top wall 121 and a plurality of walls 122, 123, 124, 125, 126, and 127. Wall 122 extends from top wall 121 to wall 124 and wall 123 extends from top wall 121 to wall 125. Walls 122 and 123 are opposite each other. Wall 126 extends from wall 124 and wall 127 extends from wall 125 and walls 126 and 127 are opposite each other. Walls 124 and 125 are parallel to top wall 121 and perpendicular to walls 126 and 127. Top wall 121 has an opening 128. Wall 124 has a tab 131 and wall 125 has a tab 132. Walls 121, 122, 123, 124, 125, 126, and 127 cooperate to form a semiconductor device receiving area 138. A fastening portion 141 having an opening 142 extends from wall 126 and a fastening portion 143 having an opening (not shown) extends from wall 127. Preferably, saddle 101 is a unitary structure formed of a plastic material.

Semiconductor component 100 is formed by inserting semiconductor device 102 into semiconductor device receiving area 138 of saddle 101. Tabs 131 and 132 secure semiconductor device 102 in semiconductor device receiving area 138.

Figure 5:
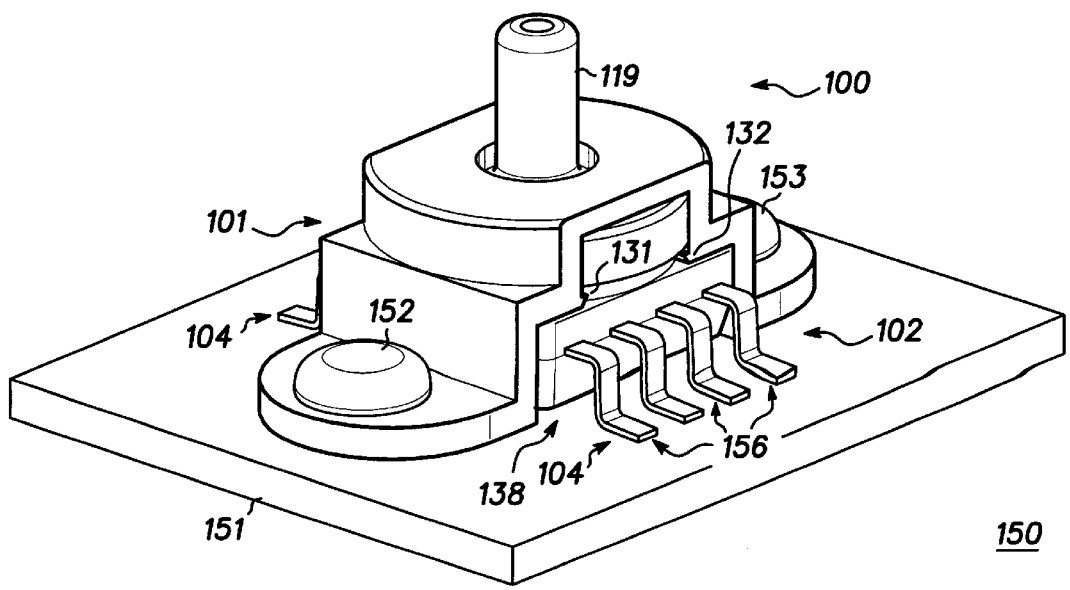
FIG. 5 is an isometric view of an electronic assembly having the semiconductor component of FIG. 4 mounted on a substrate.

FIG. 5 is an isometric view of an electronic assembly 150 having semiconductor component 100 mounted on a substrate 151. It should be understood that the same reference numerals are used in the figures to denote the same elements. For purposes of clarity, some of the reference numerals from FIG. 4 are not shown in FIG. 5. By way of example, semiconductor component 100 is compatible with standard surface mounting processes and is mounted onto substrate 151 using standard semiconductor pick and place equipment. Saddle 101 is coupled to substrate 151 via fasteners 152 and 153, thereby clampably coupling semiconductor device 102 to substrate 151. In other words, semiconductor device 102 is coupled to substrate 151 by attaching saddle 101 to substrate 151. It should be noted that saddle 101 is not attached to semiconductor device 102. As discussed hereinbefore, tabs 131 and 132 secure semiconductor device 102 in semiconductor device receiving area 138. Although saddle 101 is shown as being coupled to substrate 151 by fasteners 152 and 153, this is not a limitation of the present invention. Saddle 101 can be coupled to substrate 151 by other techniques such as, for example, adhesively bonding saddle 101 to substrate 151. The leads such as leads 104 are soldered to substrate 151.

Similar to saddle 34 discussed with reference to FIG. 3, saddle 101 minimizes mechanical stresses that are applied to the leads or an electrical interface 156 between the leads and substrate 151. These stresses can cause failure of electrical interface 156, i.e., failure of the electrical bonds between the leads and substrate 151. For example, when a hose (not shown) is connected to hose barb 119, mechanical stresses from the weight of the hose and the bending of the hose are applied to semiconductor device 102. These mechanical stresses cause semiconductor device 102 to move within semiconductor device receiving area 138. Saddle 101 limits the movement of semiconductor device 102, thereby reducing the mechanical stresses applied to electrical interface 156 compared to electronic assemblies without saddle 101.

By now it should be appreciated that a semiconductor mounting structure and a method for coupling a semiconductor device to a substrate have been provided. An advantage of the present invention is that it reduces mechanical stresses applied to the electrical interface between the leads of the semiconductor device and the substrate. Further, the present invention is compatible with standard surface mount processes and suitable for use with standard semiconductor pick and place equipment. offers the advantage of the rigidly of board mounting Another advantage of the present invention is that it decouples mechanical stresses from the semiconductor device. These stresses include mechanical stresses from mounting and thermal mismatch of materials. The present invention decouples these stresses by not rigidly attaching the semiconductor mounting structure to the semiconductor device.

What is claimed is:

1. A solid-state pressure gauge for use on a circuit board of a type having conductive traces exposed on a first surface of the circuit board, the solid-state pressure gauge comprising:

a hose port sized to receive a hose from a pressure source to be measured;

electrical leads having first attachment areas;

a semiconductor device providing an electrical measure of pressure;

a sensor body supporting the semiconductor device in a fluid communication with the hose port and supporting the electrical leads in electrical communication with the semiconductor device, the sensor body exposing the hose port and attachment areas of the electrical leads;

a saddle having second attachment areas and providing an inner surface conforming to and removably abutting at least a portion of the sensor body when the sensor body is attached to a circuit board with the first attachment areas of the electrical leads abutting conductive traces of the circuit board and the saddle is positioned with the second attachment areas abutting the first surface of the circuit board so as to capture the sensor body between the circuit board and the saddle to expose the electrical leads and the hose port.

2. The semiconductor component of claim 1, wherein the saddle is a unitary structure formed of plastic.

3. The semiconductor component of claim 1, wherein the saddle further includes:

a first wall;

a second wall extending from the first wall;

a third wall extending from the first wall;

a fourth wall, wherein the second wall extends from the first wall to the fourth wall;

a fifth wall, wherein the third wall extends from the first wall to the fifth wall;

a sixth wall extending from the fourth wall; and a seventh wall extending from the fifth wall, wherein the first, second, third, fourth, fifth, sixth, and seventh walls form the semiconductor device receiving area.

4. The semiconductor component of claim 1, wherein the saddle further includes:

a first side;

a second side extending from the first side;

a third side extending from the first side and opposite the second side;

a fourth side extending from the first side; and a fifth side extending from the first side and opposite the fourth side, wherein the first, second, third, fourth, and fifth sides form the semiconductor device receiving area.

5. The semiconductor component of claim 4, further including:

a first fastening portion extending from the second side; and a second fastening portion extending from the third side.

6. The semiconductor component of claim 4, wherein the second side has at least one tab and the third side has at least one tab.

7. The semiconductor component of claim 4, wherein the fourth side has a notch.

8. The semiconductor component of claim 4, wherein the first side has an opening.

* * * * *